United States Patent [19]

Eschbach et al.

[11] Patent Number: 5,635,812
[45] Date of Patent: Jun. 3, 1997

[54] THERMAL SENSING POLYMERIC CAPACITOR

[75] Inventors: Florence O. Eschbach, Sunrise, Fla.; Jose M. Fernandez, Lawrenceville, Ga.

[73] Assignee: Motorola, Inc., Schaumburg, Ill.

[21] Appl. No.: 314,846

[22] Filed: Sep. 29, 1994

[51] Int. Cl.$^6$ ............................... H01M 10/46
[52] U.S. Cl. ................................. 320/1; 526/255
[58] Field of Search ....................... 320/1, 2, 30, 35; 310/311, 315; 425/135; 252/62.9 R; 526/255, 249

[56] References Cited

U.S. PATENT DOCUMENTS

| | | | |
|---|---|---|---|
| 3,210,607 | 10/1965 | Flanagan | 317/40 |
| 3,622,848 | 11/1971 | Hendrix et al. | 317/258 |
| 4,282,532 | 8/1981 | Markham | 346/75 |
| 4,439,811 | 3/1984 | Sasaki et al. | 361/313 |
| 4,512,431 | 4/1985 | Bloomfield | 177/210 R |
| 4,633,122 | 12/1986 | Radice | 310/339 |
| 4,633,123 | 12/1986 | Radice | 310/339 |
| 4,656,234 | 4/1987 | Murayama et al. | 526/255 |
| 4,666,198 | 5/1987 | Heiserman | 294/86.4 |
| 4,684,337 | 8/1987 | Bauer | 425/135 |
| 4,690,143 | 9/1987 | Schroeppel | 128/419 |
| 4,792,667 | 12/1988 | Chen | 235/488 |
| 4,904,894 | 2/1990 | Henry et al. | 310/328 |
| 4,920,794 | 5/1990 | Ingman | 73/269 |
| 4,946,913 | 8/1990 | Kappler | 526/87 |
| 4,975,616 | 12/1990 | Park | 310/339 |
| 5,035,917 | 7/1991 | Kammermaier et al. | 427/41 |
| 5,087,679 | 2/1992 | Inukai et al. | 526/249 |
| 5,089,741 | 2/1992 | Park et al. | 310/332 |
| 5,336,422 | 8/1994 | Scheinbeim et al. | 252/62.9 |
| 5,359,253 | 10/1994 | Hikmet | 425/174.6 X |

OTHER PUBLICATIONS

Internal Memo from Atochem Sensors, Ltd. Entitled "Thermal Detector", 1990.
Article entitled: "Advances in Passive Infrared Sensors BaSed on Pyroelectric Polymer Films" by M. Thompson, Atochem Sensors, Valley Forge, Pa. P/N 1004832-1, 1991.

Primary Examiner—Edward Tso
Attorney, Agent, or Firm—Kenneth M. Massaroni

[57] ABSTRACT

A thermal sensing polymeric device (110) such as a capacitor is fabricated from a layer of a copolymeric material (112) including polyvinylidene fluoride and a fluorinated ethylene. The fluorinated ethylene may be selected from the group including trifluoroethylene and tetrafluoroethylene. The thermal sensing polymeric device may be a capacitor fabricated of polyvinylidene fluoride-trifluoroethylene copolymeric material. In such an application, the capacitor device exhibits a change in capacitance as the temperature to which the device is exposed is changed. Specifically, as the temperature of the polymeric material crosses a threshold transition temperature, a substantial change in its capacitance is observed.

22 Claims, 14 Drawing Sheets

THERMAL SENSING POLYMERIC CAPACITOR

TECHNICAL FIELD

The instant invention relates in general to thermal sensing devices, and in particular to thermal sensing devices fabricated of polymeric materials.

BACKGROUND OF THE INVENTION

Polymeric and copolymeric materials possessing ferroelectric characteristics have been known in the art for a number of years. Ferroelectricity refers to the generation of an electrical signal in response to a change in a physical stimulus. Ferroelectric characteristics can be broken down into one of two general categories: piezoelectric and pyroelectric materials. Pyroelectric materials generate an electrical signal in response to a change in temperature sensed by the material. Piezoelectric materials generate an electrical signal in response to a change in localized pressure. Each of these effects result from changes in polarization that require a redistribution of surface charges in the material.

Ferroelectric materials exhibit a ferroelectric to paraelectric transition known as the Curie transition temperature (Tc). When subjecting a ferroelectric material to temperatures above the Tc, dipoles of the material become mobile. By applying an electrical field to the material while it is above the Tc, polarized regions of the material will become preferentially oriented. By maintaining the field applied to the ferroelectric material as it is cooled below the Tc, the orientation polarization remains. The remanent polarization disappears if the sample again is heated to or above Tc. The dipoles once again become mobile and can reorient themselves in random order in the absence of an applied electric field. Thus, Tc is the temperature at which polarization, and hence ferroelectric response, is lost. Devices relying on ferroelectric responses generated by polarized ferroelectric polymers can therefore only be used for applications occurring below their Curie transition temperature. Once Tc has been exceeded, the material must be "reset" by applying a polarizing field at temperatures above Tc.

One ferroelectric polymer which has been the subject of substantial investigation is polyvinylidene fluoride ("PVDF"). PVDF has been widely studied due to the variety of its crystalline phases. At least five crystalline phases have been reported for PVDF, three of which are polar ferroelectric, crystalline forms. Accordingly, PVDF and its copolymers exhibit relatively good piezoelectric and pyroelectric response.

Numerous devices have been fabricated with polymeric materials, such as PVDF, taking advantage of the piezoelectric and/or pyroelectric effect thereof. For example, U.S. Pat. No. 4,666,198 to Heiserman describes a piezoelectric polymer microgripper device. Similarly, U.S. Pat. No. 5,089,741 to Park, et al describes a piezofilm impact detector with pyro-effect elimination. Finally, a publication to Brown, from ATOCHEM Sensor Ltd., dated Dec. 14, 1990 describes a thermal detector taking advantage of the piezoelectric and pyroelectric characteristics of PVDF copolymers.

However, each of the above cited references makes use of the piezoelectric and pyroelectric characteristics of the materials. That is, the devices rely upon the electrical current generated by the material in response to a change in physical stimuli. Requiring the device into which the PVDF polymeric or copolymeric material is incorporated to have the ability to read the generated electrical current substantially increases the complexity of the device. This is attributable in part to the fact that the piezoelectric and pyroelectric devices are active in that they are generating electrical current.

Accordingly, there exists a need for a thermal sensing device which takes advantage of the inherent characteristics of PVDF polymers and copolymers, without regard to the piezoelectric and pyroelectric characteristics thereof. The device should be fairly simple in that it should not require additional circuit elements to be incorporated into the circuit into which it is disposed, and should be reliable so as to be readily usable over many cycles, and in a wide range of temperatures and frequencies.

DETAILED DESCRIPTION OF THE PREFERRED EMBODIMENT

Figure 1:
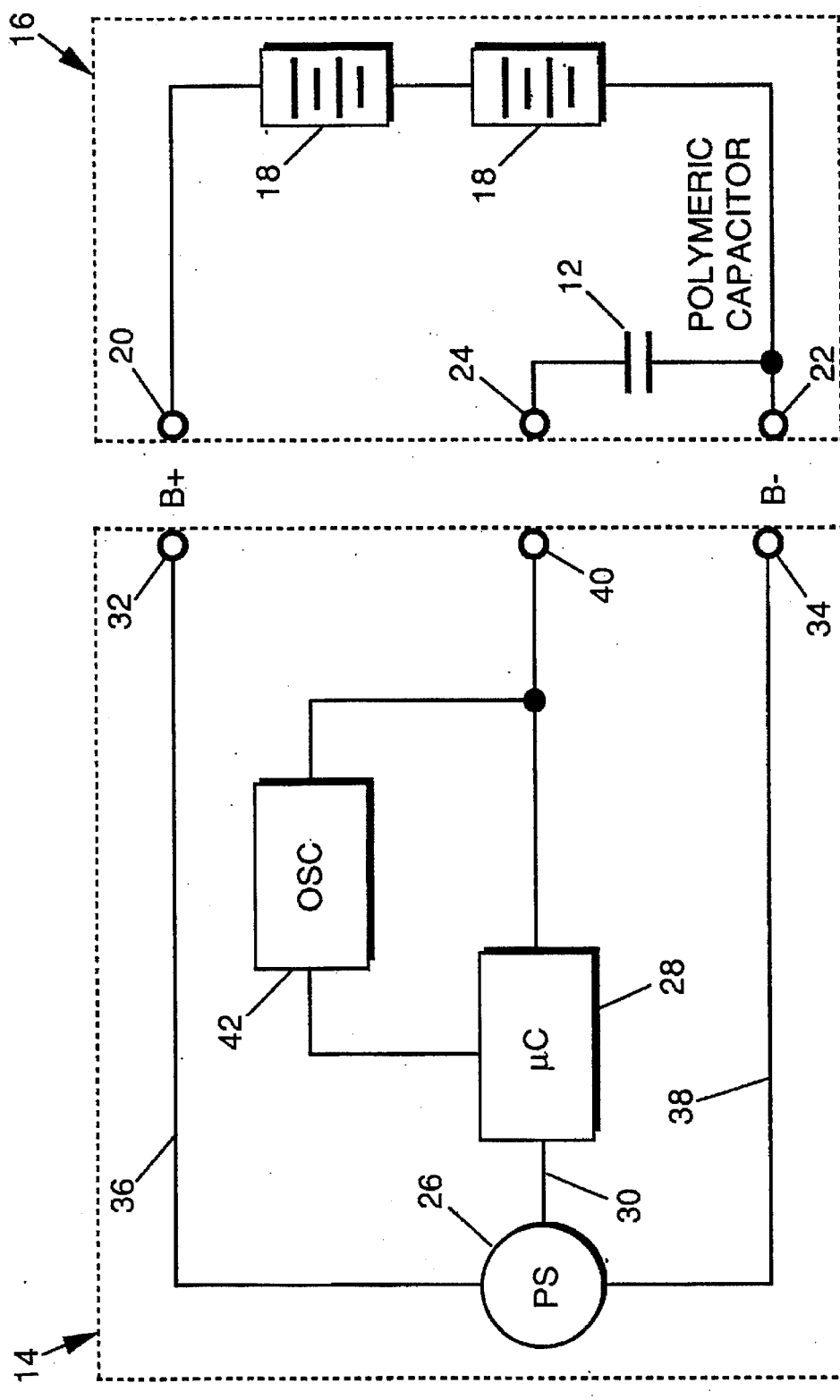
FIG. 1 is a block diagram of a battery charging system having a polymeric capacitor device disposed therein, in accordance with the instant invention.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, there is illustrated therein a block diagram of a battery charging system (10) including a thermal sensing polymeric device (12), in accordance with the instant invention. The battery charging system (10) includes a battery charger (14) and a battery pack (16). The battery pack includes at least one battery cell (18) and a pair of battery contacts (20) and (22) for electrically coupling the battery pack to either the charger (14) or alternatively, to a device to be powered by the battery pack (not shown). The battery pack further includes a third contact (24) for allowing the thermal sensing polymeric device (12) to communicate with the battery charger (14).

The battery charger (14) includes a power source (26) electrically communicating with a microcontroller (28) via control line (30). The battery charger (14) further includes electrical contacts (32) (34) for making electrical connection with electrical contacts (20) (22) respectively of battery pack (16). Contact (32) is electrically coupled to the power supply (26) via line (36) while contact (34) is electrically coupled with power supply (26) via line (38). The battery charger (14) further includes a third contact (40) for electrically coupling the power supply (26) with the battery pack (16) via the thermal sensing polymeric device (12) at contact (24). Electrically disposed between the microcontroller (28) and contact (40) is an oscillator (42). The microcontroller (28) controls the oscillator (42) to determine the capacitance of the thermal sensing polymeric device (12).

The polymeric device (12) may be a polymeric capacitor, such as a parallel plate capacitor, which is thermally coupled to the battery cells (18) in the battery pack (16). The polymeric device (12) is thermally coupled in order to optimize the heat transfer from the cell (18). As the cell or cells (18) heat, the capacitance of the polymeric capacitor (12) changes in a manner described in greater detail hereinbelow. The microcontroller (28) via the oscillator (42) relates the capacitance change into a temperature change. In this manner it is possible to determine when the battery cell (18) and battery pack (16) are heating up to the point where continued charging will degrade the performance or characteristics of the battery pack, or indeed result in catastrophic failure thereof. Charging of the cells (18) may thus be terminated when a preselected capacitance value is reached.

The thermal sensing polymeric device (12) such as the polymeric capacitor illustrated in FIG. 1 may be fabricated of polymers which exhibit ferroelectric behavior. It is important to note however that the instant invention does not rely upon the electrical current generated by the ferroelectric material. Rather the instant invention relies upon a change in capacitance or dielectric constant which occurs as the material passes through its Curie Transition Temperature.

The polymeric material used for the capacitor device is characterized by a ferroelectric to paraelectric transition temperature, the Curie Transition Temperature (Tc). At this transition, the material exhibits a change, specifically an increase in capacitance. Thus, a first capacitance is associated with temperatures below the transition temperature and a second capacitance is associated with temperatures above the transition temperature. The transition temperature may be modified to occur in a wide range of temperatures between about 50° C. up to about 200° C.

Polymers also possess many mechanical characteristics which make them desirable for various applications. For example polymers are generally very flexible. Thus polymer films may be cast or molded into various shapes and sizes dictated by a particular application. For example, a flexible polymer film may be made to conformally cover the battery cells (18) of battery pack (16). This represents a significant advantage over older crystalline materials. Further manufacturing of polymer films is generally easier and less costly than for crystalline materials.

The polymeric material is typically a copolymer or terpolymer of polyvinylidene fluoride and a fluorinated ethylene. Examples of an appropriate fluorinated ethylene in the copolymer of the instant invention include trifluoroethylene, tetrafluorethylene, chlorotrifluoroethylene, hexafluoropropylene, and combinations thereof. The copolymeric material of the instant invention can be represented by the following formula:

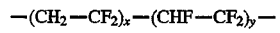

(VDF)     (TrFE)

The values for the variables x and y specify the relative proportion of each polymer in the copolymeric material, and Y=1–X. The composition of the polyvinylidene fluoride-trifluoroethylene copolymer typically varies from X=50% to 100%, corresponding to a range for Y of 0% to 50%. Other types of copolymer materials may also be used in the instant invention. For example, vinylidene cyanide copolymers, and nylons, particularly odd number nylons, such as Nylon 11, Nylon 5, and Nylon 7, are reported to exhibit ferroelectric behavior. Accordingly these materials may likewise be accompanied by substantial changes in the capacitance or dielectric electric constant at the Tc thereof.

Terpolymeric materials may be fabricated from the base copolymer described hereinabove, (PVDF-TrFE) along with the addition of a third polymer. The third polymer may be selected from the group of materials including chlorotrifluoroethylene, hexafluoropropylene, and combinations thereof. The third polymer may be present in ranges of between 0 and 20%. Accordingly, employing the formula described hereinabove, the third component would be added in which the variable describing the concentration would be z, and the ranges for z being between 0 and 20%, y is in the range of 0 to 50%, and x is in the range of 30 to 100%.

Figure 2:
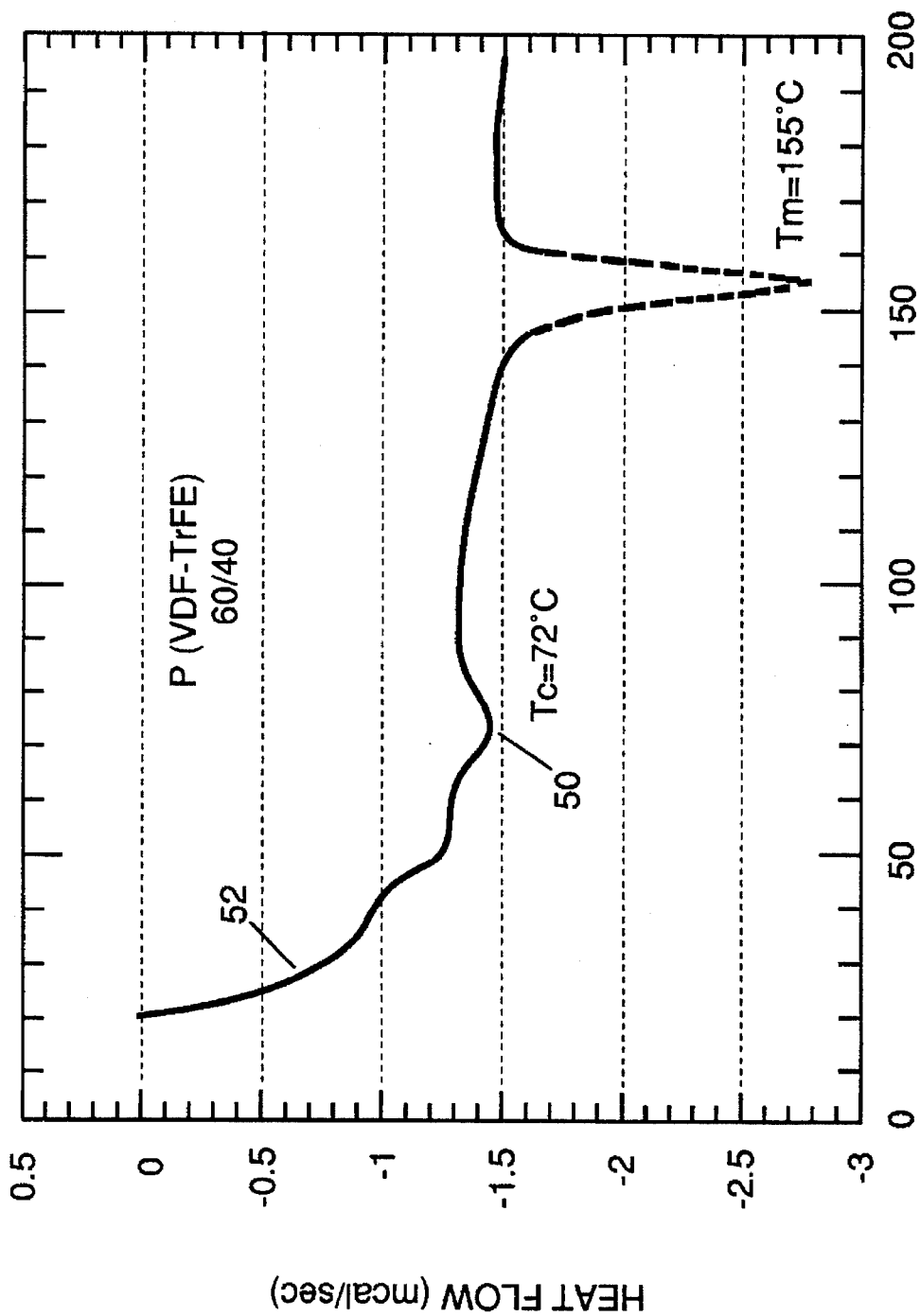
FIG. 2 is a differential scanning calorimetry of a polyvinylidene fluoride-trifluoroethylene copolymer having a composition of 60% vinylidene fluoride, 40% trifluoroethylene, in accordance with the instant invention.
Figure 3:
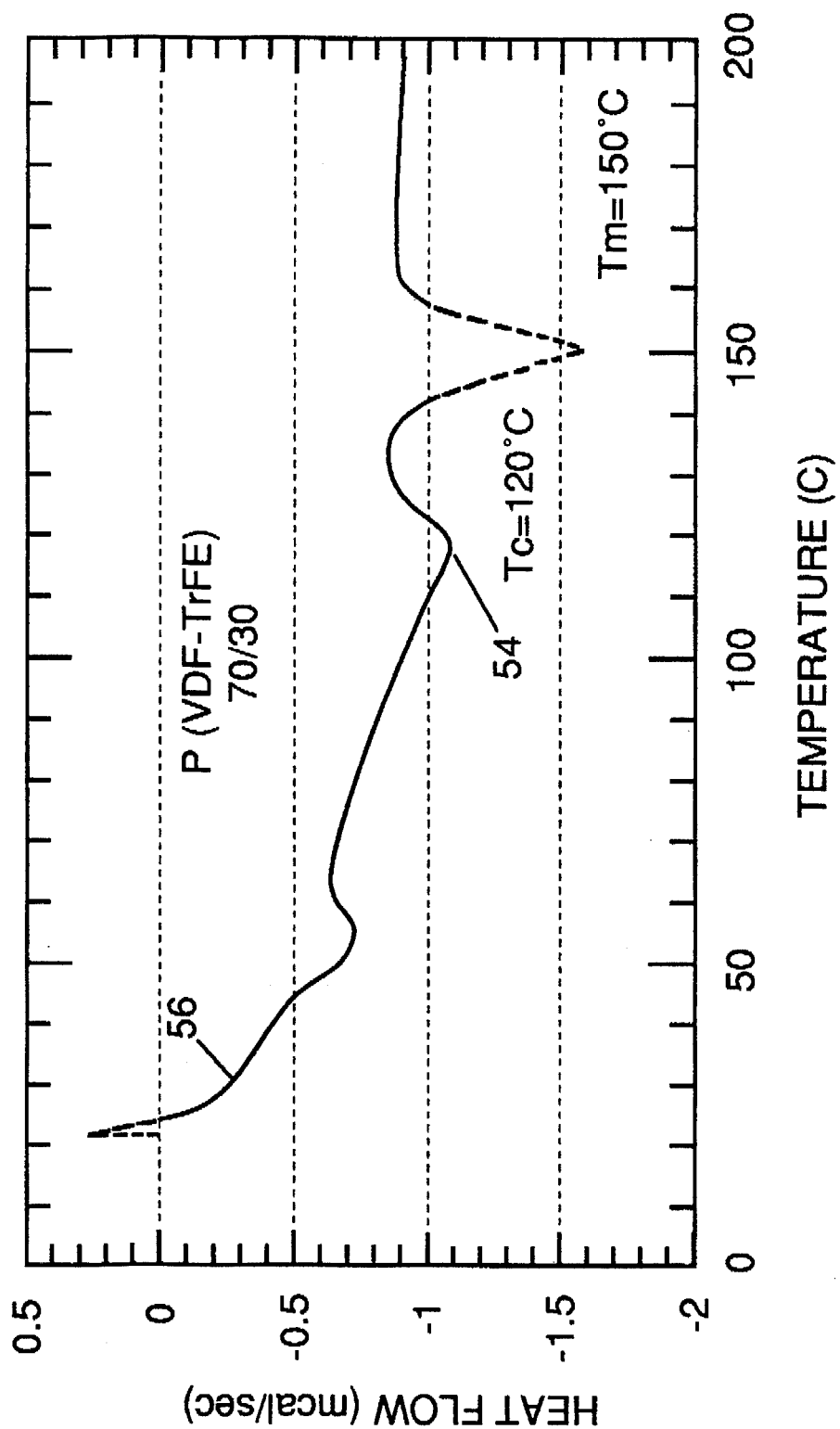
FIG. 3 is a differential scanning calorimetry of a polyvinylidene fluoride-trifluoroethylene copolymer having a composition of 70% vinylidene fluoride, 30% trifluoroethylene, in accordance with the instant invention.
Figure 4:
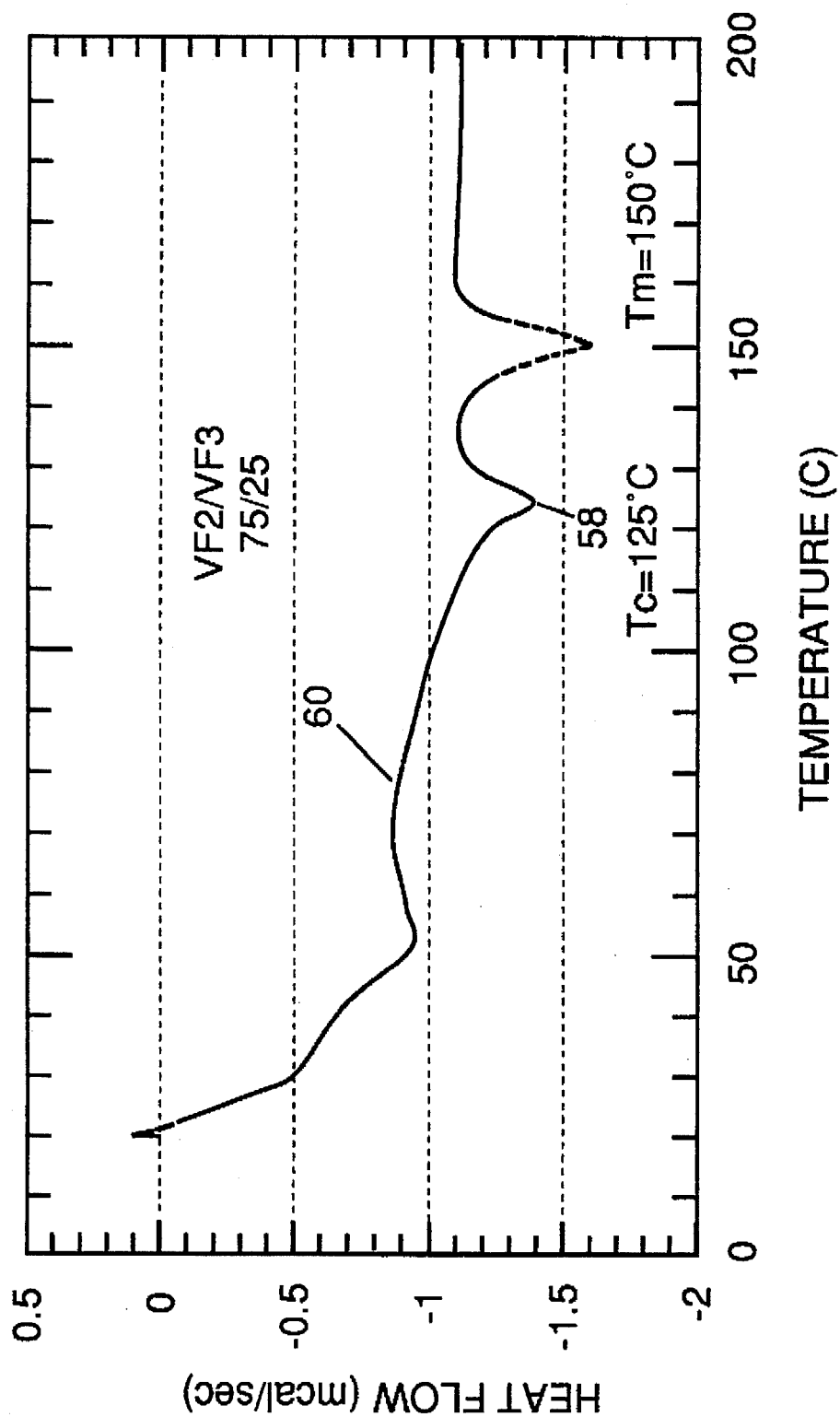
FIG. 4 is a differential scanning calorimetry of a polyvinylidene fluoride-trifluoroethylene copolymer having a composition of 75% vinylidene fluoride, 25% trifluoroethylene, in accordance with the instant invention.
Figure 5:
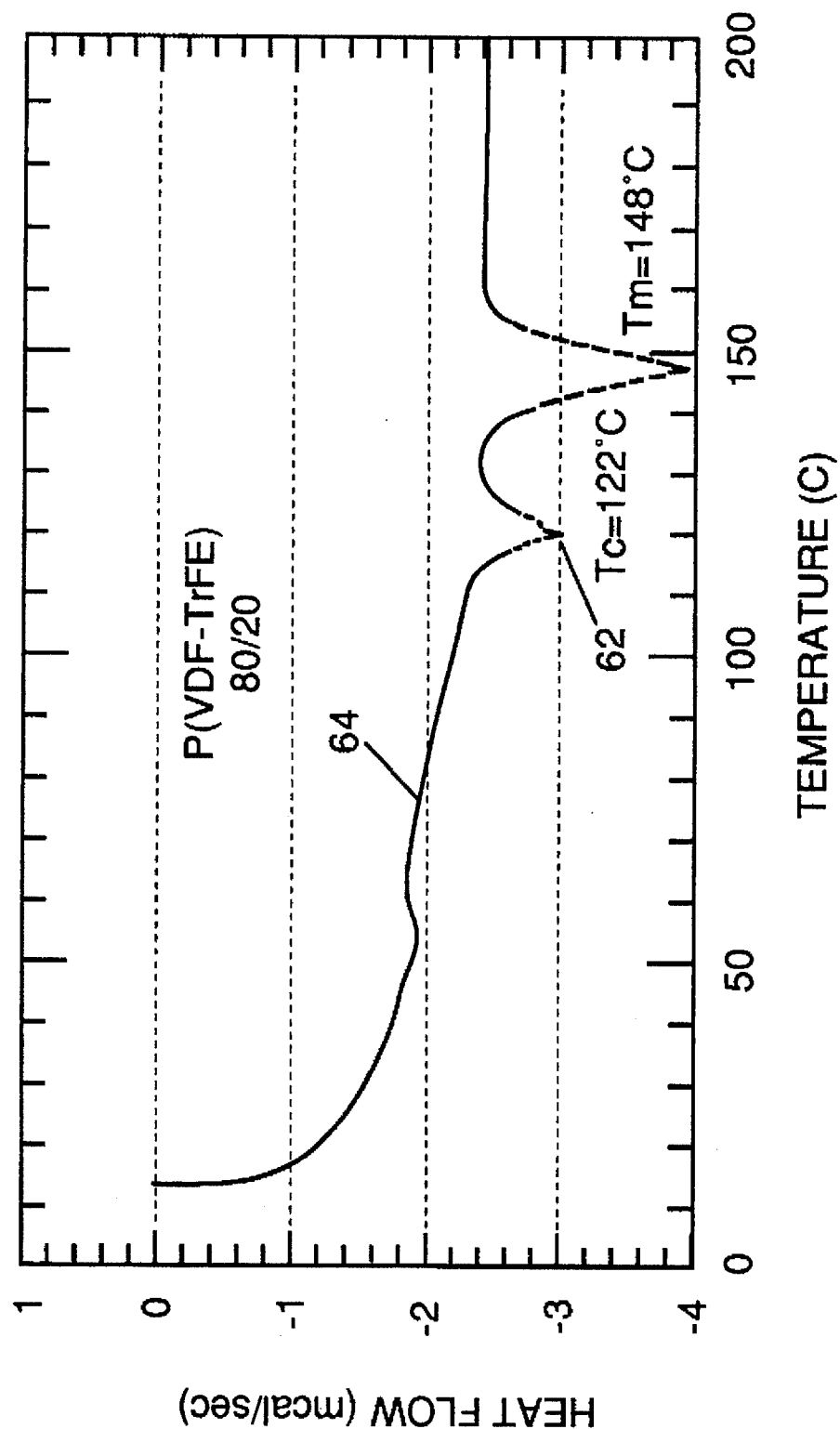
FIG. 5 is a differential scanning calorimetry of a polyvinylidene fluoride-trifluoroethylene copolymer having a composition of 80% vinylidene fluoride, 20% trifluoroethylene, in accordance with the instant invention.

Referring now to FIGS. 2–5, there is illustrated therein a series of differential scanning calorimetry analyses of polyvinylidene fluoride-trifluorethylene copolymers containing, respectively, 40%, 30%, 25%, and 20% of trifluoroethylene. The transition temperature between the ferroelectric and the paraelectric condition of, for example, the polyvinylidene fluoride-trifluoroethylene copolymer is dependent upon the amount of polyvinylidene fluoride in the copolymer. More particularly, as the proportion of vinylidene fluoride increases, the transition temperature of the copolymer likewise increases. As may be appreciated from a perusal of FIGS. 2–5, the transition temperature generally increases with increasing vinylidene fluoride content from approximately 72° C. in FIG. 2, with 60% vinylidene fluoride to 125° C. in FIG. 5 with 80% vinylidene fluoride. More particularly in each of FIGS. 2–5, the transition temperature between the ferroelectric and the paraelectric condition is identified by an endothermic peak in the differential scanning calorimetry trace. In FIG. 2 the transition temperature occurs at point 50 on line 52. The second endothermic peak, occurring at about 155° C., corresponds to the melting point of the copolymer crystalline phase. Similarly in FIG. 3, the transition temperature of approximately 120° C. is identified at point 54 on line 56 with the melting point occurring about 150° C. In FIG. 4, Tc is identified by point 58 on line 60, and corresponds to approximately 125° C., while the melting point is at about 150° C. In FIG. 5, Tc is at point 62 on line 64 and corresponds to about 122° C., with a 148° C. melting point. It may be further appreciated that with increasing concentrations of vinylidene fluoride in the copolymer the transition temperature begins to move closer to the melting point of the copolymeric material which is itself identifiable by the second endothermic peak occurring in each of lines 52, 56, 60 and 64.

EXAMPLES

The copolymeric materials used to fabricate the thermal sensing polymeric device (12), such as the capacitor illustrated in FIG. 1, rely upon changes in the capacitance of the polymeric material which occur at the ferroelectric to paraelectric transition.

The capacitance of a polymeric material used in, for example a parallel plate capacitor, as illustrated in FIG. 1 can be calculated from the following formula.

$$C = \epsilon' \epsilon_o \frac{A}{d}$$

where $\epsilon'$ is permitivity of the dielectric polymeric material; $\epsilon_O$ is the permitivity of a vacuum ($8.854 \times 10^{-12}$ F/m), A is the surface area of the dielectric, and d is the thickness of the dielectric polymer.

For purposes of using a copolymeric material in a polymeric parallel plate capacitor as described herein, a polyvinylidene-fluoride trifluorethylene copolymer in the ratio of 60 to 40 was selected upon which to conduct further characterizing experiments. This material was selected since its Curie Transition Temperature (Tc=72° C.) provides a relatively useful temperature for thermal sensor applications in, for example, battery overcharge protection systems. Using a material such as that described hereinabove and illustrated in FIG. 2, numerous experiments were run on samples in order to calculate the real permitivity of the material, the reproducibility and cycleability of the material, and the material's dependence upon frequency. For these experiments, a 200 μm thick, circular (2 cm diameter) sample of polyvinylidene fluoride-trifluoroethylene (60% vinylidene fluoride, 40% trifluoroethylene) was placed between two gold electrodes in a dielectric analyzer (DEA). The dielectric constant was then measured over a temperature range of between 25° C. and 140° C. for eight cycles.

Dielectric analysis provided information on both the capacitive (insulating) nature of the material (i.e., the ability of the material to store electrical charge) and the conductive nature of the material (i.e., ability to transfer electric charge). A sinusoidal voltage of 1 volt was applied to the sample, creating an alternating electric field. This field produced polarization in the sample oscillating at the same frequency as the electric field but with a phase angle shift δ. The phase shift was measured by comparing the applied voltage to the measured current. The measured current was separated into capacitive and conductive contributions using the following equations:

$$C = \frac{I_{measured}}{V_{applied}} \frac{\sin\delta}{2\pi f}$$

$$\frac{1}{R} = \frac{I_{measured}}{V_{applied}} \cos\delta$$

where C is the capacitance (Farads), R is the resistance of the polymer material (Ohms), I the current (Amp), V the voltage (Volts), f the applied frequency (Hz), and δ the phase angle shift.

The following variables were measured by the dielectric analyzer:

$\epsilon'$: permitivity which is proportional to the capacitance and measures the alignment of dipoles; and $\epsilon''$: loss factor which is proportional to conductance and represents the energy required to align dipoles and move ions.

For a parallel plate capacitor configuration $\epsilon'$ and $\epsilon''$ are related to the capacitance and the conductance by the following equations:

$$\epsilon' = \frac{Cd}{\epsilon_o A}$$

$$\epsilon'' = \frac{d}{RA 2\pi f \epsilon_o}$$

where the variables are as defined above. Tables 1 and 2 below report values of capacitance and resistance (1/conductance) measured on the copolymer over a wide range of temperatures and frequencies. It is important to note that the resistance of the copolymer always remains superior to kOhms confirming that the copolymer exhibits poor conducting properties.

Charges accumulating on the electrodes of the capacitor will therefore not easily be transferred from one electrode to another, which is an attribute of good energy storage devices, e.g. capacitors.

Figure 6:
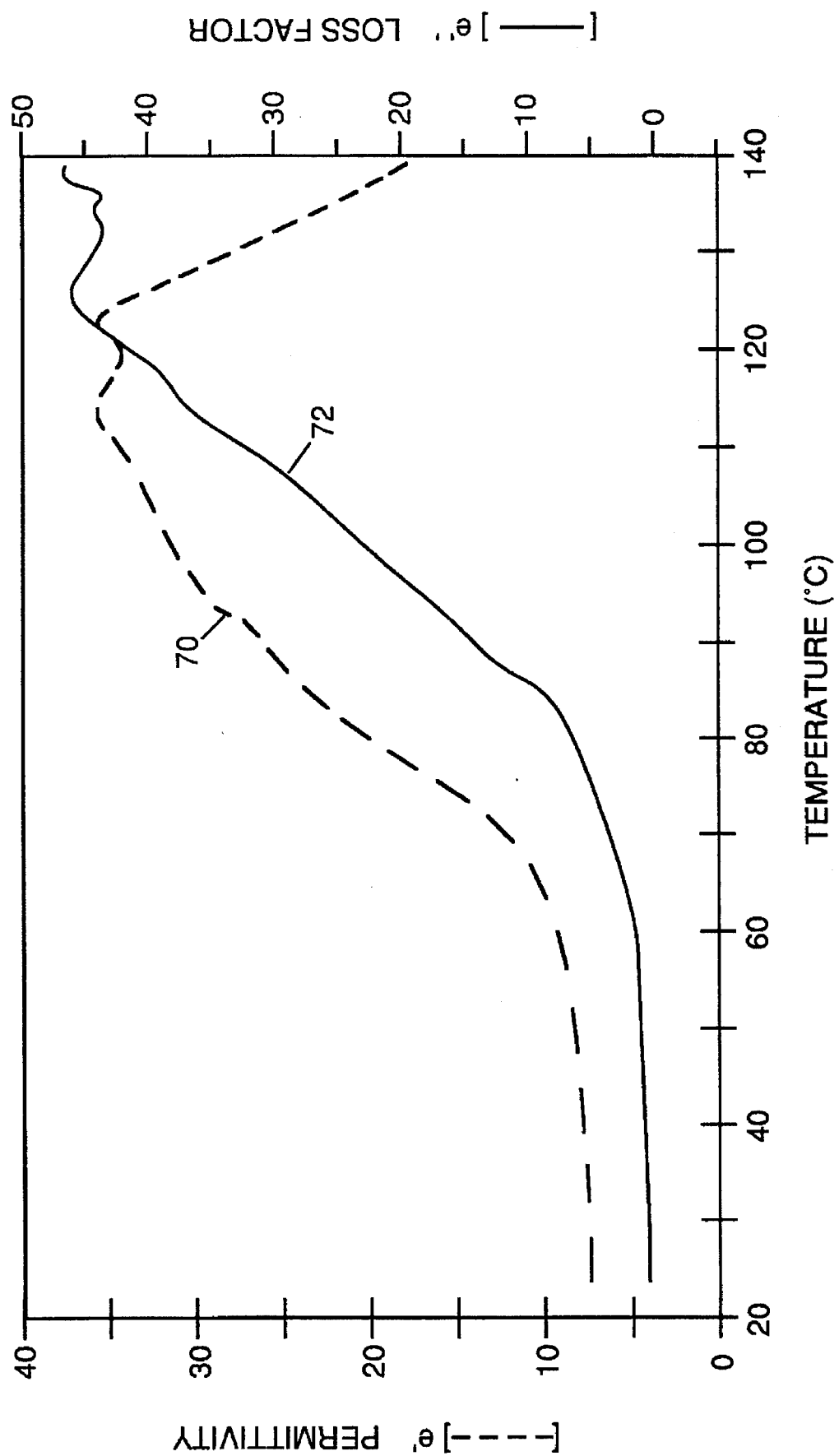
FIG. 6 is a dielectric analysis (DEA) of a polyvinylidene fluoride-trifluoroethylene copolymer, as in FIG. 2, in accordance with the instant invention.

Referring now to FIG. 6, there is illustrated therein a dielectric analysis ("DEA") chart for a 60/40 mixture of polyvinylidene fluoride-trifluoro-ethylene polymeric material, illustrating real permitivity on line 70 thereof. The real permitivity $\epsilon'$ was measured at a frequency of 1 Kh over a temperature range from 25° C. to 140° C. The value of the capacitance at 25° C. is $1.6 \times 10^{-10}$ F. At 120° C., the value of the capacitance increased by approximately 1 order of magnitude to approximately $1.36 \times 10^{-9}$ F. As may be appreciated from FIG. 6, permitivity increases dramatically as the temperature passes Tc=72° C.

Figure 7:
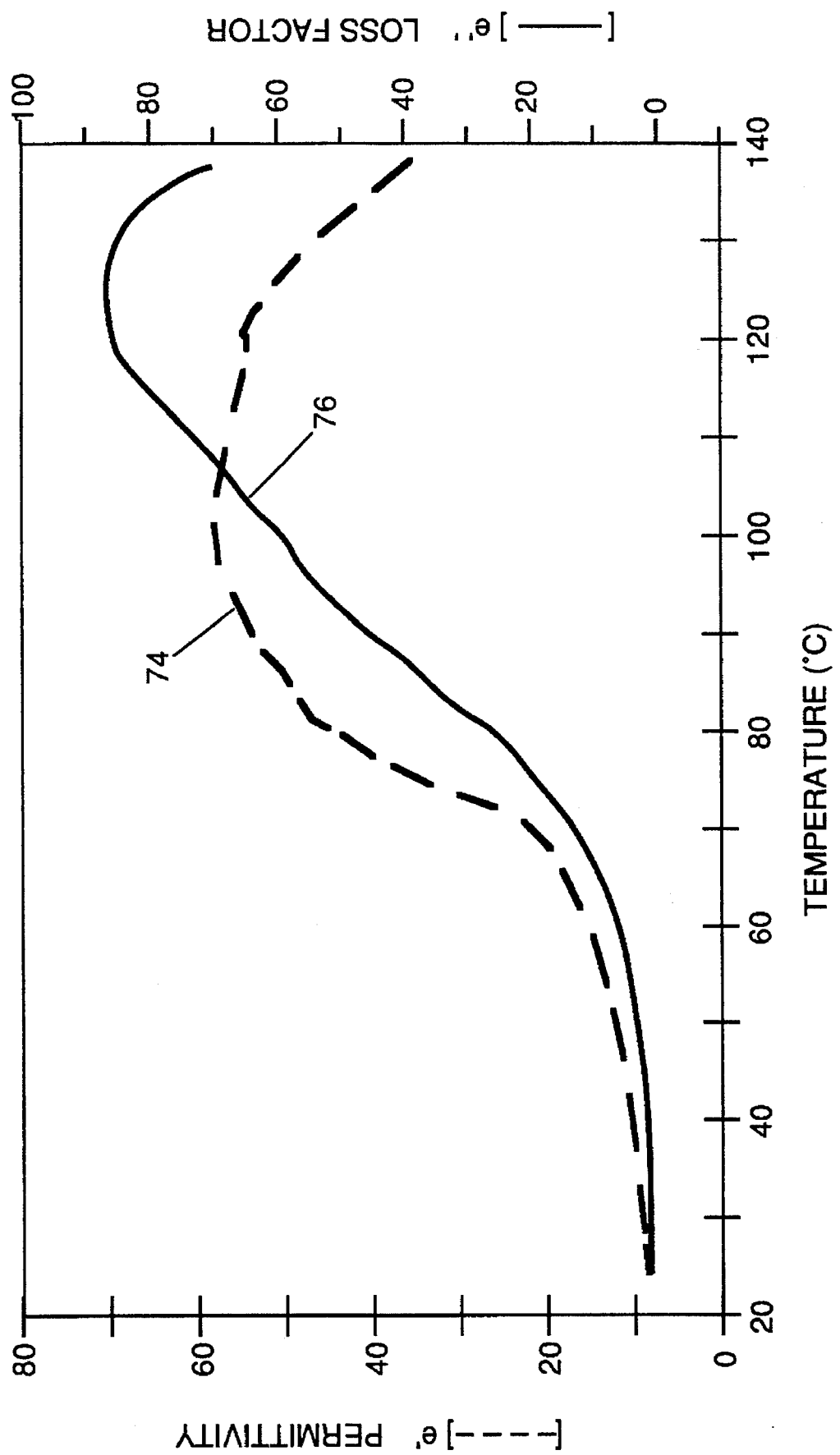
FIG. 7 is a dielectric analysis of the sample of FIG. 6 taken after the second cycle.
Figure 8:
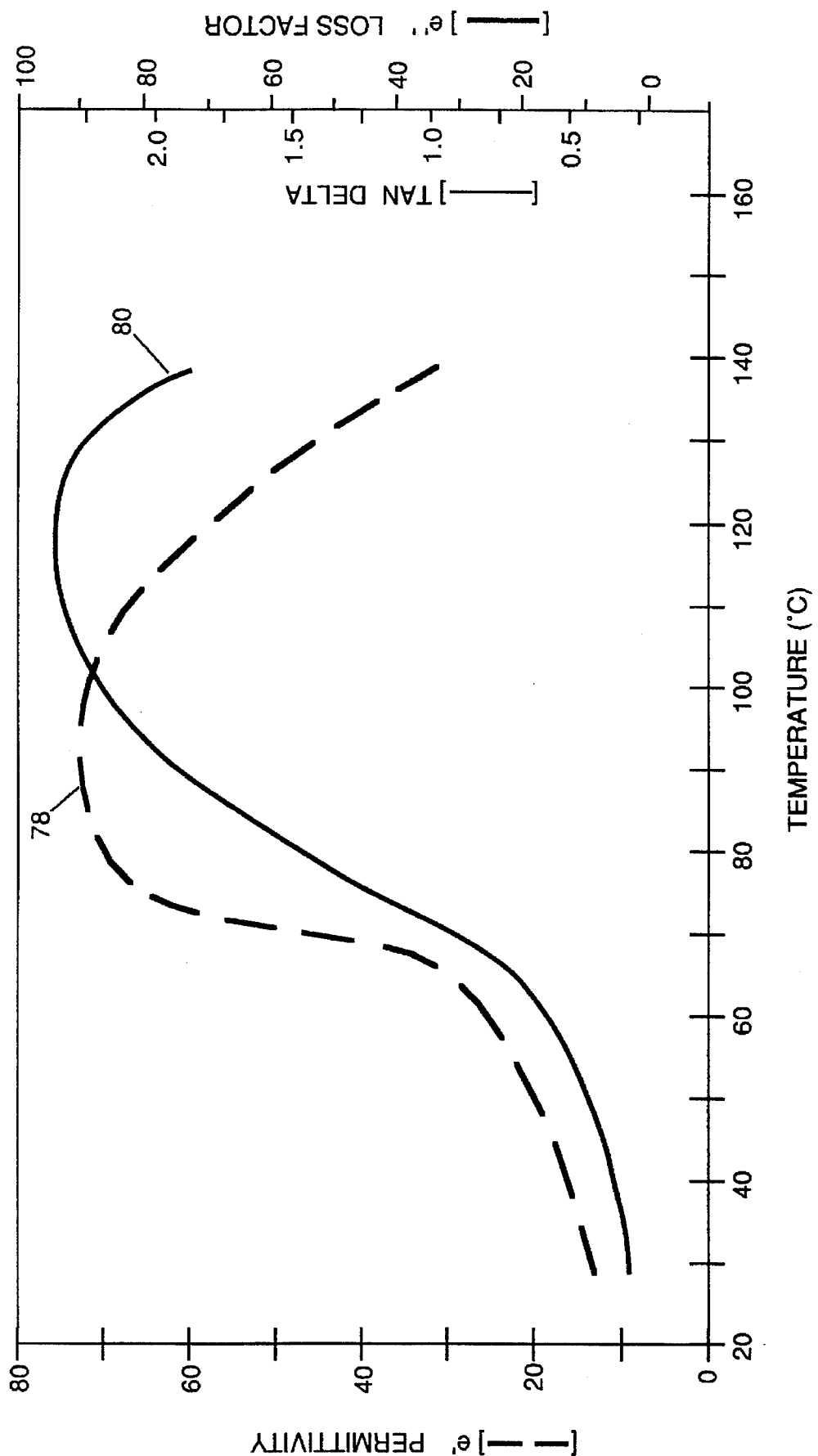
FIG. 8 is a dielectric analysis of the sample of FIG. 6 taken after the third cycle.
Figure 9:
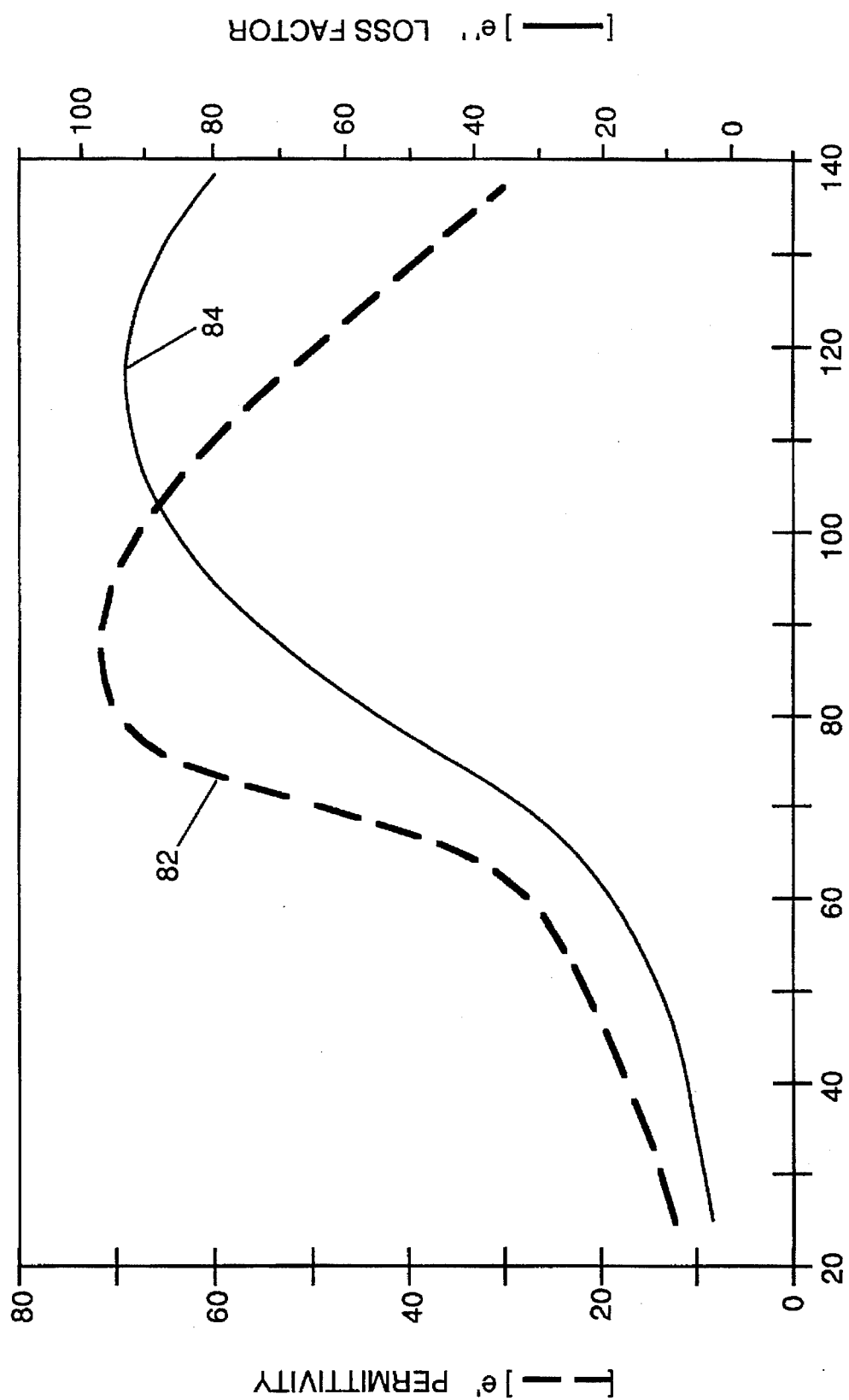
FIG. 9 is a dielectric analysis of the sample of FIG. 6 taken after the eighth cycle.

Referring now to FIG. 7, there is illustrated a DEA plot of the sample analyzed in FIG. 6, on a second cycle of the same sample at the same frequency. In FIG. 7 as temperature increases, $\epsilon'$ increases to reach a maximum at 110° C. $\epsilon'$ and $\epsilon''$ are illustrated on lines 74 and 76 respectively. These values are slightly higher than that measured in the first run illustrated in FIG. 6 though the overall profile of increasing permitivity with increasing temperature remains constant, as does rapid increase in $\epsilon'$ after Tc. Similarly, during a third cycle illustrated in FIG. 8 hereof, $\epsilon'$ continues to increase and the peak value of $\epsilon'$ is shifted to a lower temperature. Specifically $\epsilon'$ is approximately 70 corresponding to a capacitance of $1.6 \times 10^{-9}$ F. This peak, however is reached at approximately 90° C. After the third cycle, the behavior of the polymer was reproducible and extremely consistent over eight cycles. $\epsilon'$ and $\epsilon''$ are illustrated on line 78 and 80 respectively. This is illustrated in FIG. 9 wherein the peak value of $\epsilon'$ is 70 ($1.6 \times 10^{-9}$ F) and occurs at approximately 90° C. as is illustrated in FIG. 8. Moreover, the profiles for permitivity $\epsilon'$ and loss factor $\epsilon''$ remain extremely consistent, with only slight deviations occurring after peak permitivity is reached. Moreover, onset of significant increases in $\epsilon'$ are consistent, though begin occurring slightly below Tc.

Figure 10:
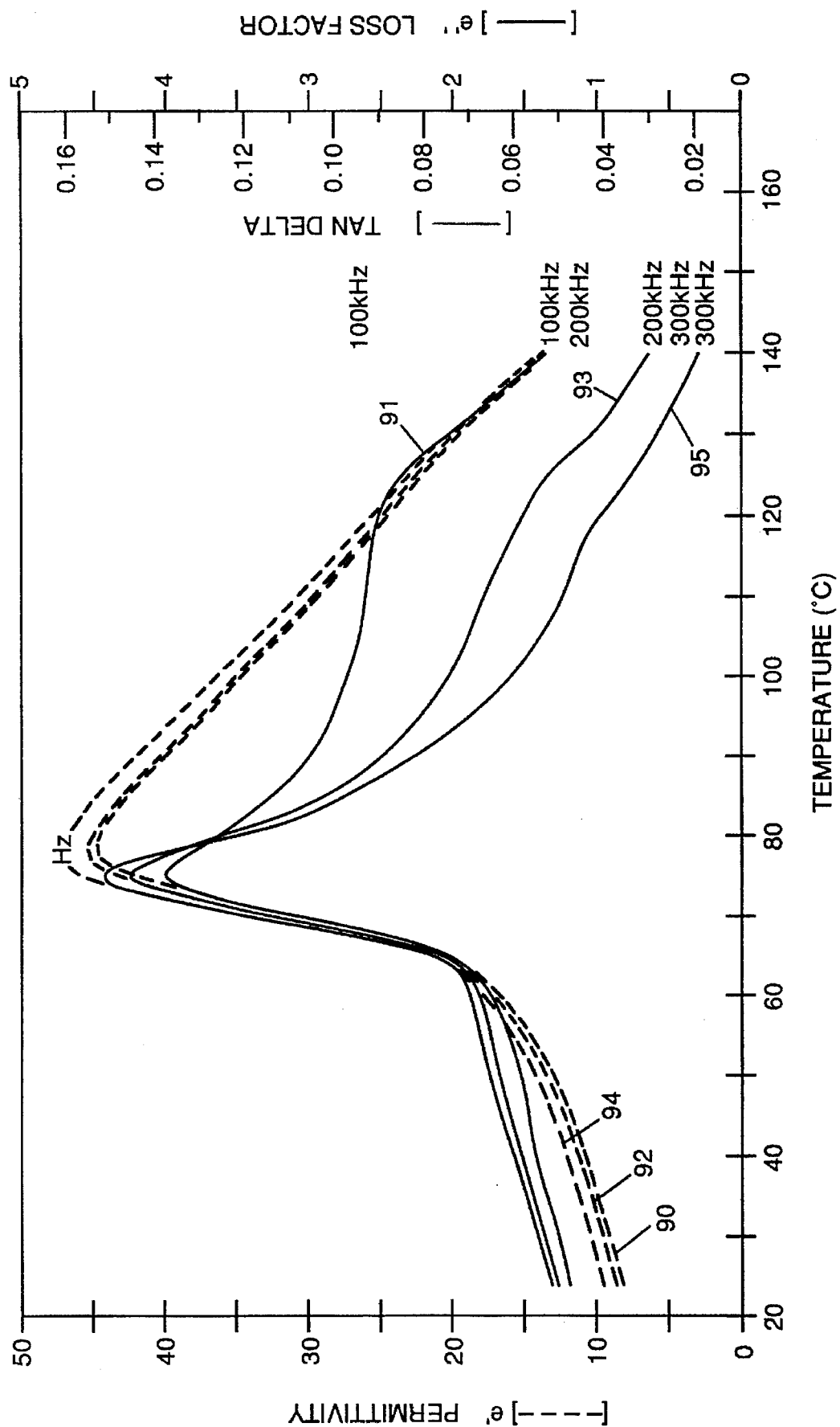
FIG. 10 is a series of dielectric analysis of a polymeric material in accordance with the instant invention, taken after six cycles, and at various frequencies.

Referring now to FIG. 10 there is illustrated therein a sample of the polymeric material as described above, in which DEA analysis is conducted at different frequencies. A sample analyzed after six cycles was measured at frequencies of 100 kH, (line 90), 200 kH (line 92) and 300 kH, (line 94), respectively. As maybe appreciated from a perusal of FIG. 10, the effect of frequency on permitivity is extremely small, though peak $\epsilon'$ is much sharper at higher frequencies than that obtained at 1 kH (See FIGS. 6–9). The peak values of $\epsilon'$ are also inferior to those measured at 1 kH. Values for $\epsilon''$ follow a similar pattern as illustrated in lines 91, 93 and 95 respectively.

Figure 11:
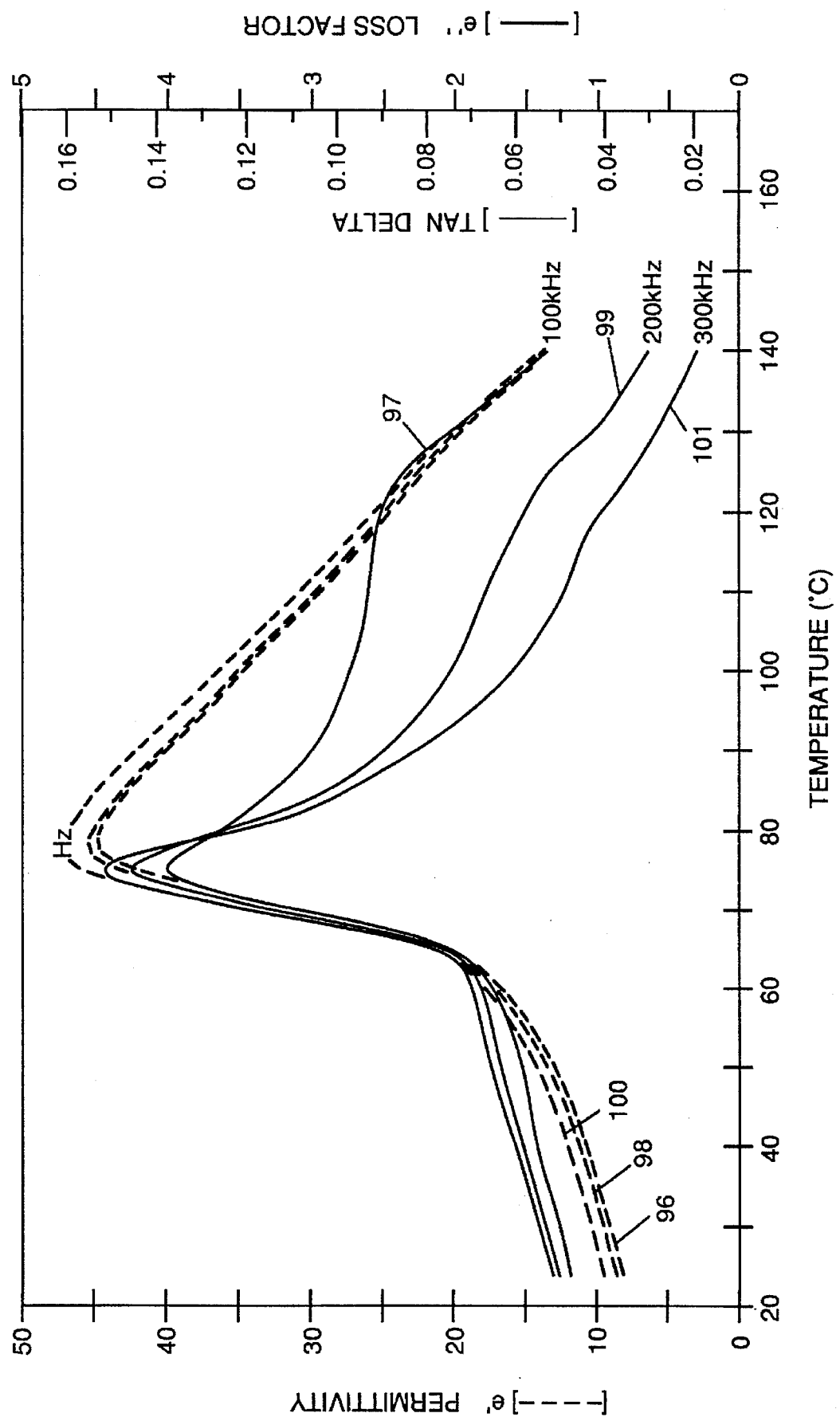
FIG. 11 is a series of dielectric analysis of a polymeric material in accordance with the instant invention, taken after eight cycles, and at various frequencies.

Referring now to FIG. 11, there is illustrated therein a second DEA analysis with measurements taken at 100 kH (line 96), 200 kH (line 98) and 300 kH (line 100) after eight cycles of the material described in FIG. 10. $\epsilon''$ is illustrated on lines 97, 99 and 101 respectively. Again it may be appreciated that material response is highly reproducible. Reproducibility is important to assure uniform response in a device into which the polymeric material is incorporated. Differences between the peak values and transition temperatures of both tests are virtually identical due to the fact that at high frequencies, the dipoles have less time to reorient themselves. High frequencies cannot produce an orientation polarization as large as that observed at lower frequencies since the lower frequency allows more time for dipoles to reorient, and therefore contribute to $\epsilon'$. Using the results collected from FIGS. 6–11, it particularly FIGS. 9–10, the following tables can be constructed.

TABLE 1 from FIG. 9: 1 kHz

| Temp (°C.) | $\epsilon'$ | C(F) | $\epsilon''$ | R(Ohms) |
| --- | --- | --- | --- | --- |
| 25° C. | ~1 | 1.7 10$^{-10}$ | 1 | 9.25M ohms |
| 80° C. | 70 | 1.2 10$^{-9}$ | no peak | — |
| 120° C. | no peak | — | 95 | 97 k ohms |

TABLE 2 from FIG. 10:300 kHz

| Temp (°C.) | $\epsilon'$ | C(F) | $\epsilon''$ | R(Ohms) |
| --- | --- | --- | --- | --- |
| 25° C. | 10 | 1.7 10$^{-10}$ | 1 | 30 k Ohms |
| 75° C. | 45 | 7.7 10$^{-10}$ | no peak | — |
| 72° C. | no peak | — | 4.5 | 6.8 k ohms | where the values for $\epsilon'$, $\epsilon''$, $\epsilon_o$, d, and A are as given above, and $$R = \frac{d}{\epsilon'' \epsilon_o A 2\pi f}$$

Figure 12:
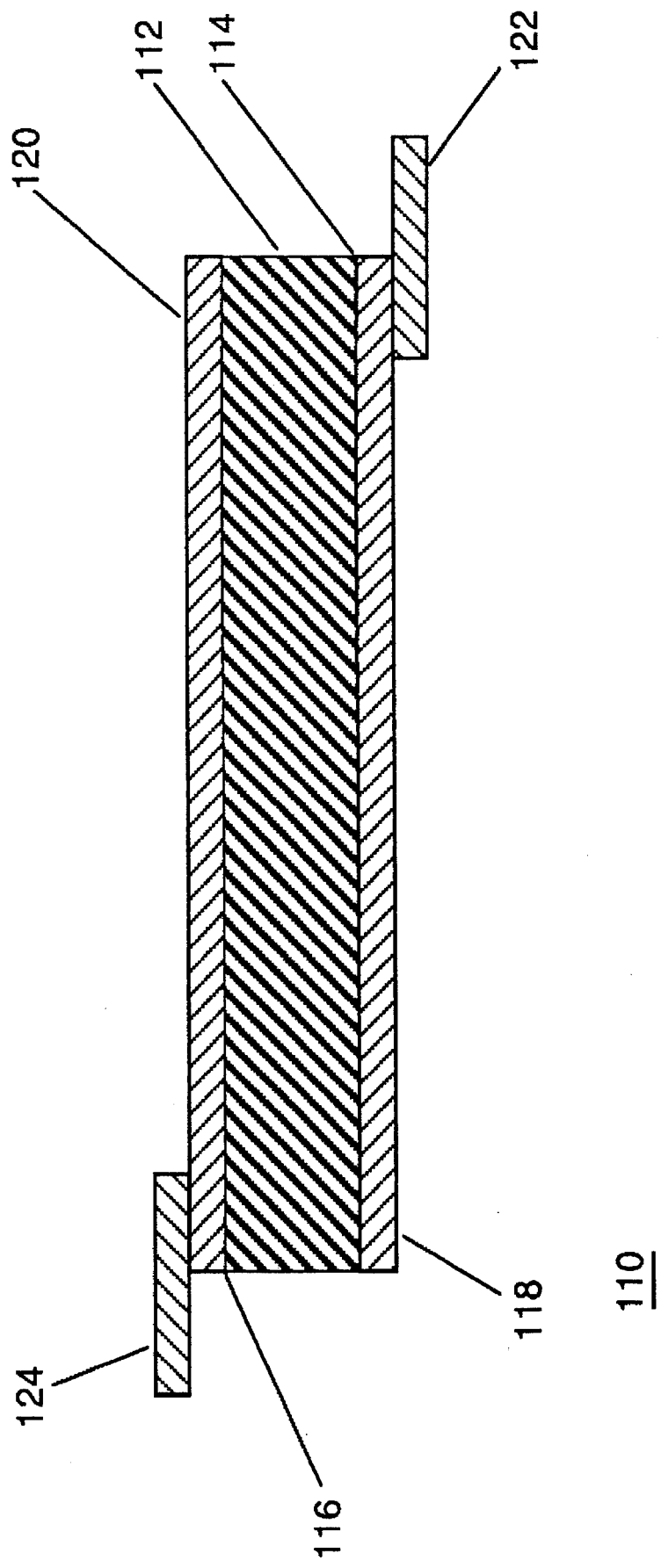
FIG. 12 is a side view of a parallel plate capacitor including a polymeric film layer, in accordance with the instant invention.

Referring now to FIG. 12, there is illustrated a side view of a parallel plate capacitor (110) including a polymer film layer (112) in accordance with the instant invention. The polymer film layer may be fabricated of, for example, a polyvinylidene fluoride-trifluoroethylene copolymer. This polymer is readily processable into a thin film by use of traditional thermal processing and spin coating techniques. Films may be readily cast into thicknesses of approximately 10 μm, by dissolving the polymer in acetone, or methylethyl ketone prior to spin coating the mixture onto an electrode substrate. Thereafter the acetone or methylethyl ketone may be evaporated by gentle heating.

A parallel plate capacitor as illustrated in FIG. 12, may be prepared by the deposition of conformal metallic or organometallic electrodes on each side of the polymer film. Conformal metallic electrodes, fabricated of materials including nickel, aluminum, copper, chromium or combinations thereof, may be deposited onto the polymer film by traditional sputtering techniques. Conformal organometallic electrodes may be deposited by plasma-enhanced chemical vapor deposition.

The layer of polymeric material (112) has first and second major surfaces (114) and (116) onto each major surface is deposited the conformal metallic or organometallic electrodes (118, 120) in a manner as described hereinabove. A weldable, conductive lead (122, 124) may then be connected to electrodes (118, 120) respectively. Thus, the final device (110) may be readily integrated into an electronic circuit as illustrated in FIG. 1.

Figure 13:
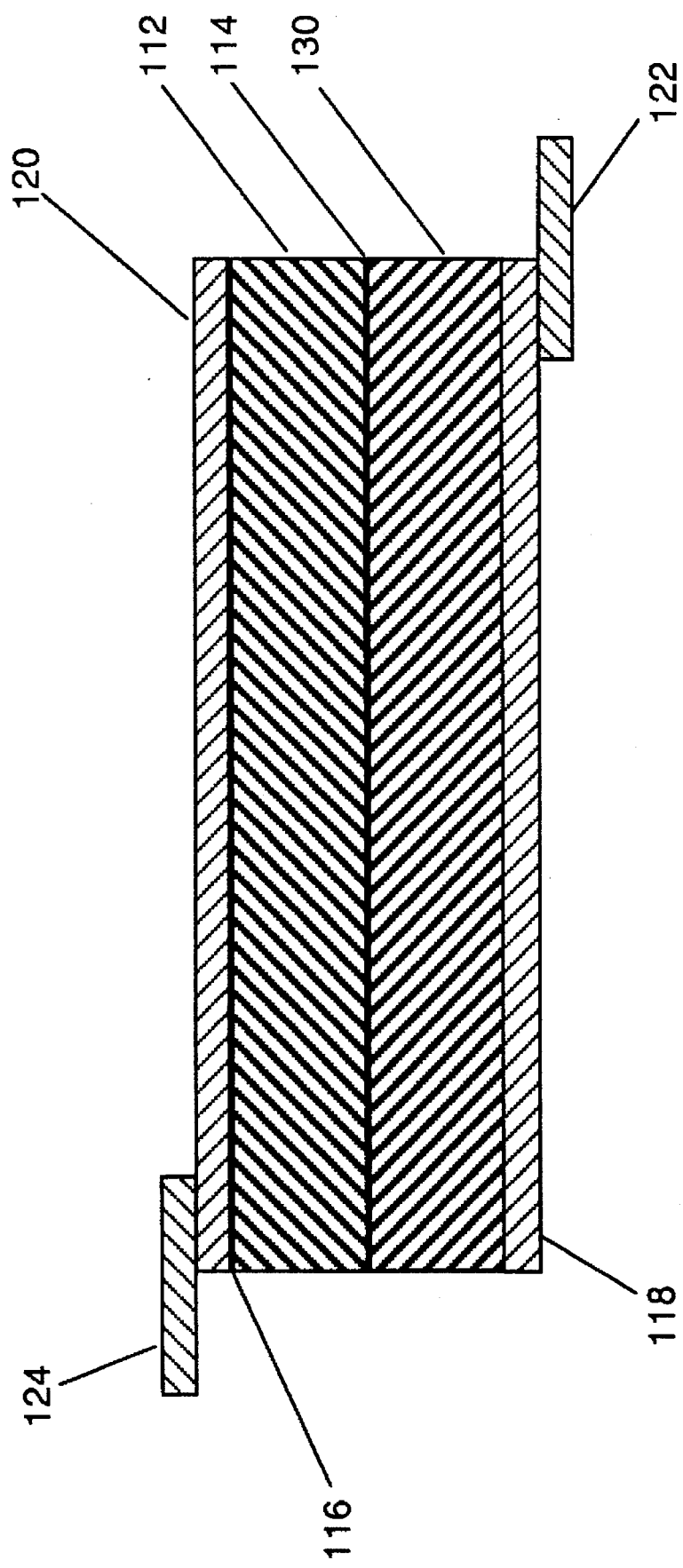
FIG. 13 is a side view of a parallel plate capacitor including a plurality of polymeric film layers, in accordance with the instant invention.

Referring now to FIG. 13, there is illustrated therein a side view of an alternative embodiment of a parallel plate capacitor as described hereinabove with respect to FIG. 12. The parallel plate capacitor illustrated in FIG. 13 includes a second polymer film layer (130) disposed between the first layer (112) and electrode (118). The purpose of providing two or more layers of polymeric material is to provide an expanded range in which the characteristics of the device may be measured. For example, by having the first layer (112) a 60/40 blend of vinylidene fluoride and trifluoroethyelene yields transition temperature of approximately 72° C. as illustrated hereinabove with respect to FIG. 2. By placing a second layer of, for example, a 70/30 material in which there is 70% vinylidene fluoride and 30% trifluoroethylene, a second peak will appear at the second transition temperature of approximately 120° C. as illustrated hereinabove with respect to FIG. 3. Accordingly, a multi plateau profile of increasing permitivity is available. This is in contrast to a dropoff which occurs after the peak is reached as described, for example, hereinabove with respect to FIG. 6.

Figure 14:
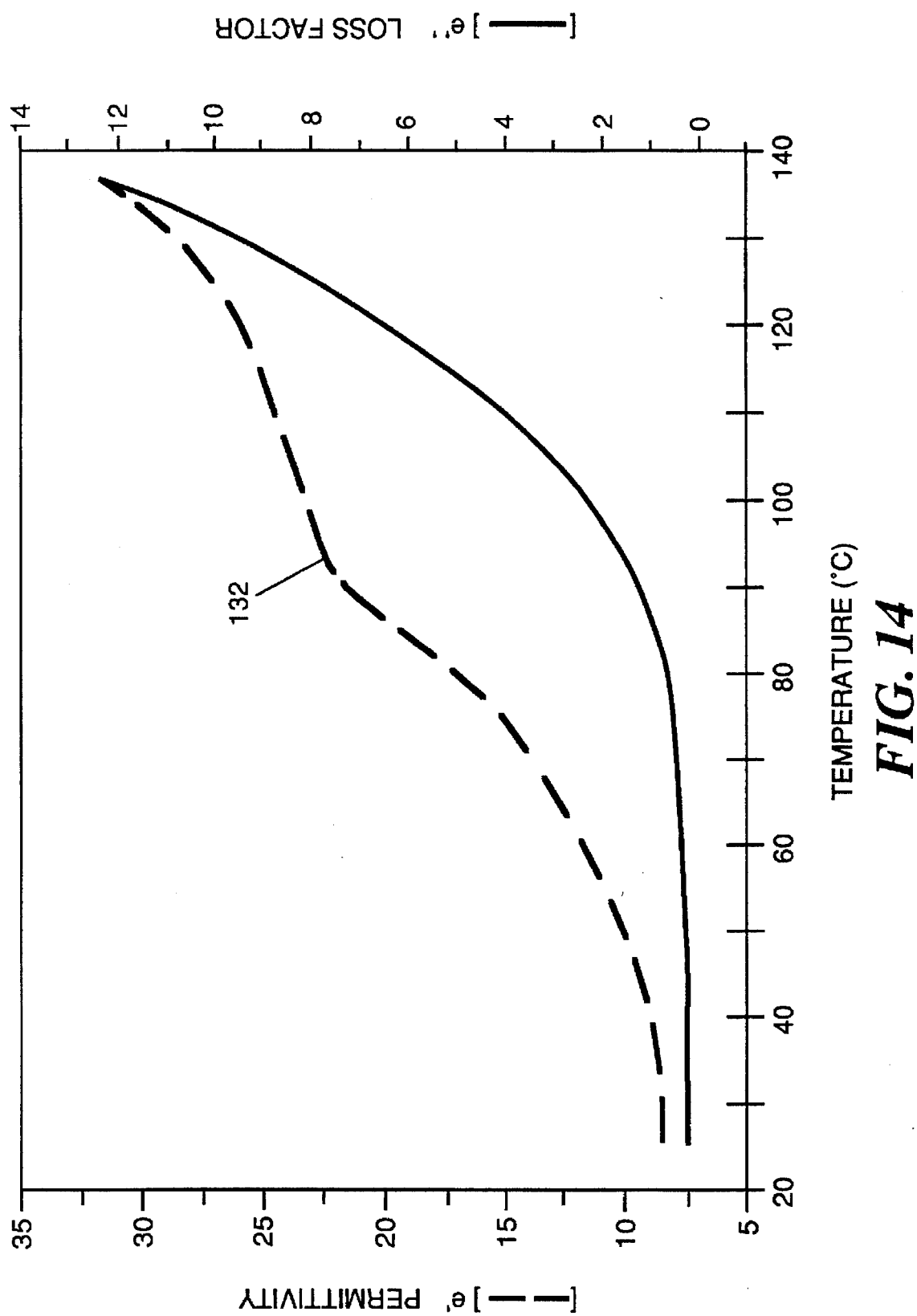
FIG. 14 is a dielectric analysis of a device as illustrated in FIG. 13.

Referring now to FIG. 14, there is illustrated therein a DEA analysis of a stacked parallel plate capacitor having two stacked layers of polymeric film material, as described hereinabove with respect to FIG. 13. As maybe appreciated from a perusal of FIG. 14, permitivity, illustrated on line 132, increases as it passes the first Curie temperature at approximately 72° C. characteristic of the 60/40 material described hereinabove and begins to increase again at approximately 120° C., the transition temperature associated with the 70/30 material. Providing a range of plateaus as illustrated herein allows for greater flexibility in the fabrication of devices.

While the instant invention has been described hereinabove in the context of a parallel plate capacitor, it is to be understood that the material may be applied advantageously in numerous other applications. For example, such a material may be used in transistor temperature sensing applications, automotive applications where increases in capacitance over temperature are beneficial, as well as battery temperature sensing applications as described hereinabove. In power transistor temperature sensing applications, one may sense the change in capacitance as the temperature of the transistor increases, thus providing either a temperature correction device, and/or an absolute shutdown point. In automotive applications, the need exists to compensate for inductive transients and average to high current startup levels. In such an application, the polymeric capacitor would be able to compensate for inductive transients, and would further provide for improved response over temperature since capacitance increases as temperature increases. With respect to battery temperature sensing applications as contemplated herein, the capacitor may be a parallel plate capacitor as illustrated herein or alternatively may be imbedded in the plastic housing of the battery pack, or physically wrapped around the battery cells in order to assure good thermal coupling between the battery cells and the device. Monitoring capacitive change over temperature would allow one to determine an ideal termination point in the charging of the batteries in the battery cell.

The device may also be used to monitor changes in reactants over temperature at different frequencies. Further, the polymeric device may be used in time constant functions. For example, capacitance change over temperature, thus the time constant instead of the capacitance or other parameter could be monitored. Similarly a time delay can be effective using this device in conjunction with a resistor simply by choosing the size of the resistor to be used and hence charge up the capacitor.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A thermal sensing polymeric device comprising a polymer characterized by a ferroelectric to paraelectric transition temperature which occurs below the melting point of said polymer, said polymer effecting a change in dielectric constant at temperatures in excess of said transition temperature.

2. A thermal sensing polymeric device as in claim 1, wherein said polymeric device is a capacitive sensor.

3. A thermal sensing polymeric device as in claim 1, wherein said transition temperature occurs between 25° C. and 200° C.

4. A thermal sensing polymeric device as in claim 1, wherein said polymer is a copolymer of poly(vinylidene fluoride) and a fluorinated ethylene.

5. A thermal sensing polymeric device as in claim 4, wherein the polyvinylidene fluoride content in said copolymer is between 50% and 100%.

6. A thermal sensing polymeric device as in claim 4 wherein the fluorinated ethylene is selected from the group consisting of trifluoroethylene, tetrafluoroethylene, chlorotrifluoroethylene, hexafluoropropylene and combinations thereof.

7. A thermal sensing polymeric device as in claim 4, wherein said copolymer further includes a third polymer.

8. A thermal sensing polymeric device as in claim 7, wherein said third polymer is selected from the group consisting of chlorotrifluoroethylene, hexafluoropropylene, and combinations thereof.

9. A thermal sensing polymeric device as in claim 7, wherein the third polymer content in said copolymer is between 0 and 20%.

10. A thermal sensing polymeric device as in claim 1, wherein said polymer includes vinylidene cyanide.

11. A thermal sensing polymeric device as in claim 1, wherein said polymer includes an odd numbered nylon.

12. A thermal sensing polymeric device as in claim 1, wherein changes in dielectric constant are a function of frequency.

13. A rechargeable battery pack comprising:

at least one battery cell;

at least a pair of charging contacts for connecting said battery pack to a source of charging current; and a polymeric capacitor device disposed between said battery pack and said source of charging current, said polymeric capacitor comprising a polymer characterized by a ferroelectric to paraelectric transition temperature, said polymer having a first capacitance at temperatures below said transition temperature, and a second capacitance at temperatures above said transition temperature.

14. A battery pack as in claim 13, wherein said transition temperature occurs between 50° C. and 200° C.

15. A battery pack as in claim 13, wherein said copolymer is a copolymer of poly(vinylidene fluoride) and a fluorinated ethylene.

16. A battery pack as in claim 15, wherein the polyvinylidene fluoride represents between 25% and 85% of the copolymer.

17. A battery pack as in claim 15, wherein the fluorinated ethylene is selected from the group consisting of trifluoroethylene, a tetrafluoroethylene, chlorotrifluoroethylene, hexafluoropropylene, and combinations thereof.

18. A battery pack as in claim 13, wherein said copolymer further includes a third polymer.

19. A battery pack as in claim 18, wherein said third polymer is selected from the group consisting of chlorotrifluoroethylene, hexafluoropropylene, and combinations thereof.

20. A battery pack as in claim 18, wherein the third polymer content in said copolymer present is between 0 and 20%.

21. A battery pack as in claim 13, wherein changes in capacitance are a function of frequency.

22. A battery pack as in claim 13, wherein said polymeric capacitor device further includes at least two layers of polymer, a first layer characterized by a first transition temperature, and a second layer characterized by a second transition temperature.

* * * * *